United States Patent [19]
Schäfer

[11] Patent Number: 5,863,620
[45] Date of Patent: Jan. 26, 1999

[54] PROCESS AND APPARATUS FOR COATING PRINTED CIRCUIT BOARDS

[75] Inventor: Hans-Jürgen Schäfer, Viersen, Germany

[73] Assignee: Ciba-Geigy AG, Basel, Switzerland

[21] Appl. No.: 545,816

[22] PCT Filed: May 10, 1994

[86] PCT No.: PCT/IB94/00102

§ 371 Date: Dec. 29, 1995

§ 102(e) Date: Dec. 29, 1995

[87] PCT Pub. No.: WO94/27190

PCT Pub. Date: Nov. 24, 1994

[30] Foreign Application Priority Data

| | | | |
|---|---|---|---|
| May 12, 1993 | [DE] | Germany | 43 15 774.2 |
| Jul. 22, 1993 | [DE] | Germany | 43 24 585.4 |
| Sep. 3, 1993 | [DE] | Germany | 43 29 731.5 |
| Sep. 3, 1993 | [DE] | Germany | 43 29 730.7 |
| Nov. 8, 1993 | [DE] | Germany | 43 37 907.9 |
| Jan. 24, 1994 | [DE] | Germany | 44 01 778.2 |

[51] Int. Cl.$^6$ .................... B05D 5/12; C08S 2/48
[52] U.S. Cl. .................. 427/508; 427/96; 427/211; 427/428; 427/553; 427/558; 118/202; 118/262; 118/263; 118/222
[58] Field of Search .................. 427/96, 97, 211, 427/428, 508, 553, 557, 558, 314; 118/202, 262, 263, 222, 66

[56] References Cited

U.S. PATENT DOCUMENTS 4,949,667  8/1990  Yoshida et al. .................. 118/262

FOREIGN PATENT DOCUMENTS

92/07679  5/1992  WIPO .

OTHER PUBLICATIONS

Research Disclosure, vol. 36, No. 024, Apr. 10, 1992, Emsworth, GB, Anonymous "Printed Circuit Board Air Track Conveyor Incorporating Heater and HEPA Filter".

Research Disclosure, vol. 272, No. 023, Dec. 10, 1986, Emsworth, GB, Anonymous, "Solder Mask Lamination".

IBM Technical Disclosure Bulletin, vol. 30, No. 10, Mar. 1988, New York, US, Anonymous, "Photoresist Adhesion to Dry–Plated Card/Board by Controlled Thermal Method".

*Primary Examiner*—Brian K. Talbot
*Attorney, Agent, or Firm*—Burns, Doane, Swecker & Mathis, LLP

[57] ABSTRACT

A process for coating printed circuit boards with a coating composition that is crosslinkable by electromagnetic radiation, especially UV radiation, using the roll coating process, is distinguished by the following process steps:

a photopolymerisable, meltable, low-molecular-weight coating composition that is highly viscous to solid at room temperature and has an average molecular weight of preferably from 500 to 1500 is melted and fed to the applicator roll of a roll coating apparatus;

the coating composition is coated at a temperature of approximately from 60° to 110° C. and a viscosity of approximately from 1000 to 20000 mPas on to the surface(s) of a printed circuit board in a thickness of approximately from 10 to 200 μm, the surface of the printed circuit board to be coated being pre-heated, prior to coating, to a temperature that is approximately from 10° to 50° C. higher than the application temperature of the coating composition.

An apparatus suitable for carrying out the process outlined above is also described.

19 Claims, 1 Drawing Sheet

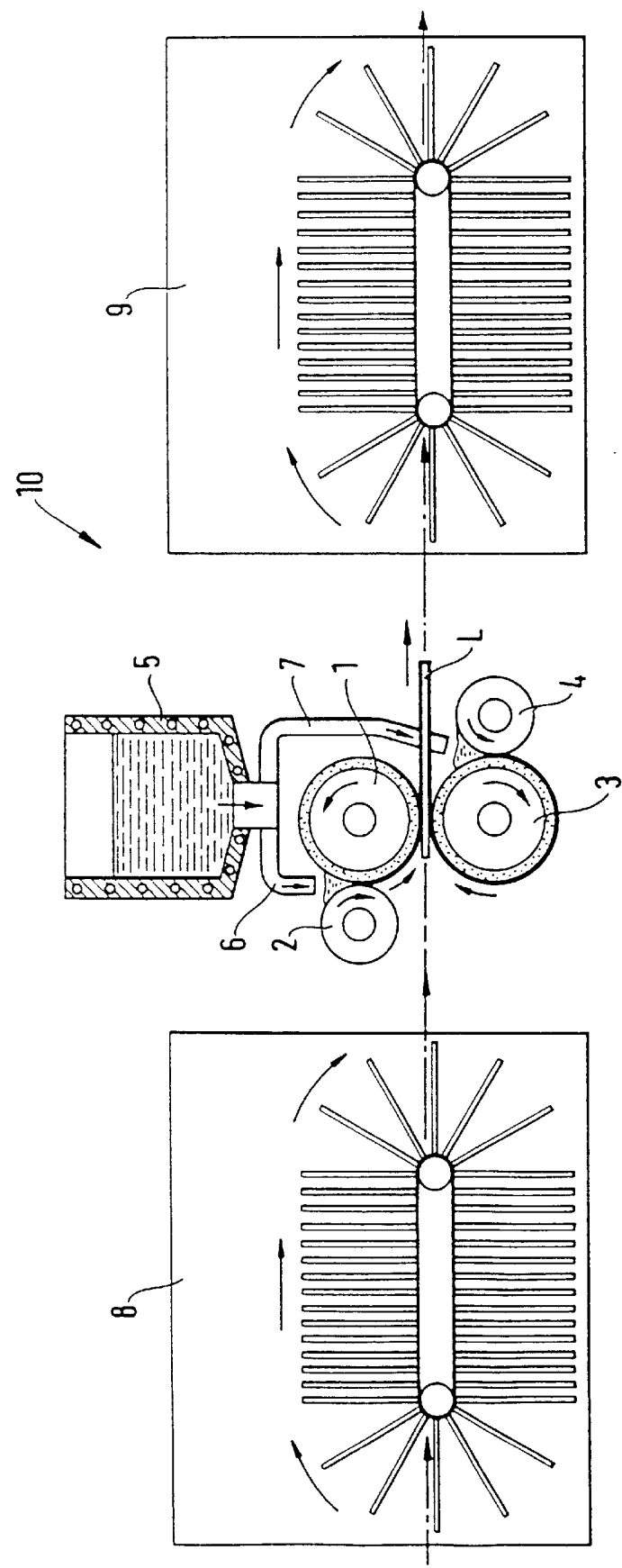

PROCESS AND APPARATUS FOR COATING PRINTED CIRCUIT BOARDS

BACKGROUND OF THE INVENTION

The invention relates to a process and apparatus for coating printed circuit boards with a coating that is crosslinkable by electromagnetic radiation, especially UV radiation The function of the printed circuit board is to provide the conductive connection to the components. As miniaturisation progresses, the number of connections is becoming ever greater, with the result not only that printed circuit board technology has produced multilevel circuitry, but also that conductive tracks are becoming ever narrower, drill hole diameters are becoming ever smaller and the number of conductive tracks between two holes is becoming ever greater.

With the development of surface-mounted devices it has been possible to achieve a further reduction in the surface area required. This has led to conductor widths of less than 100 $\mu$m, to drill hole diameters of from 0.3 to 0.2 mm and to solder point diameters of only up to 0.4 mm with up to seven conductive tracks between a drill hole grid of 2.54 mm. At the same time, more and more connections must be made per integrated circuit, which results in connection pad grids of from 0.3 to 0.4 mm. The problems resulting from the increasingly high integration density are very complex and require a comprehensive solution. They begin first with the production of the conductive pattern.

For the production of a conductive pattern, the drilled copper-clad base material is coated with a positive or negative resist. While such resists were in the past screen-printable etching or electro resists, nowadays photoresists are predominantly used, which are solid or liquid resists. They are either laminated on to the surface (solid resists) or applied by means of a pouring machine or using rolls (liquid resists). After the application of a mask, the conductive pattern is fixed, for example, by exposure to UV light, with polymerisation of the resist, and exposed by development. This leads to the so-called pattern plating process. In pattern plating, first of all a mask is applied and only the conductor-free areas are exposed and developed. The conductive tracks are then built up by electroplating and the drilled contact holes are clad with copper. After the conductors have been deposited by electroplating, they are, for example, provided with a tin coating, the electro resist is removed and the conductive pattern is etched. Since the etching speed is the same in all directions, the undercutting corresponds approximately to the thickness of the copper film used. The undercutting that occurs in the etching stage of the pattern plating process represents the limit for large-scale application of that process. Moreover, the production of conductors of equal height is frequently not possible as a result of the geometry of the bath or of the printed circuit board.

Accordingly, for microconductor technology, the so-called panel plating process was developed. In that process, starting with the drilled copper-clad base material, first of all the surface of the printed circuit board and the drilled holes are clad with copper by electroplating in order to achieve a uniform thickness of the copper layer. A dry film resist is then laminated on, exposure is effected using a mask, and development is carried out.

In the case of microconductors, however, constrictions frequently occur because the line pressure of the laminating roller is unable to compensate for uneven areas of the base material, so that the dry film resist does not adhere to the same extent in all places. It is especially important that the already copper-clad drill holes should also be protected from the effects of the etching. That is achieved by covering the holes with resist, so-called "tenting".

Further miniaturisation and the technology of surface-mounted components has led to so-called "rest-ring"-free through-holes. Dry film lamination technology cannot be used in this case, because without the so-called rest-rings the resist film cannot be attached to the surface of the printed circuit board. However, in order to be able to cover also rest-ring-free holes with resist and thus protect them from the effects of the etching, so-called electro-immersion coating was found, which deposits a resist film from 5 to 15 $\mu$m thick from a coating bath in the hole and on the surface of the printed circuit board. However, that process is very cost-intensive and, because of the thinness of the coating, can be used only together with the panel plating process.

WO 93/14444 proposes a hot coating process which is based on the use of a meltable photoresist that is highly viscous at room temperature, which photoresist, after liquefaction, is coated on to cooled printed circuit boards using the curtain pouring process. As the photomelt resist comes into contact with the cooled printed circuit boards, it is cooled at the walls of the drill holes, so that it is unable to run into the drill holes and forms over the hole a covering supported at the wall of the hole. Although cooling the printed circuit boards produces good results with printed circuit boards that are still unstructured, the technique cannot be used for cooled printed circuit boards. In that case, the conductive tracks act as cooling fins. The photomelt resist cools suddenly as it comes into contact with the conductive surface, as a result of which air can become trapped between the conductive tracks.

There are also known processes in which a coating composition is coated on to printed circuit boards by means of steel rolls. The simultaneous coating of both sides of the printed circuit boards in a roll coating apparatus having two heated applicator rolls is especially economical. For that purpose it is customary to use surface-coating systems that contain a high proportion of solvent and have a low viscosity. The surface tension must be low so that the coating is able to spread easily without forming streaks. This two-sided coating process requires the surfaces of the printed circuit boards to be as even as possible. In the coating of printed circuit boards that are already provided with conductive tracks, constrictions may occur over the conductors, so that reliable covering is not guaranteed. In addition, the hollow spaces that are present as a result of undercutting beneath the edges of the conductors are frequently not filled with coating, which leads to defective areas after soldering and allows moisture to penetrate.

Accordingly, the problem underlying the present invention is to provide a coating process that permits the production of coatings that are free of air bubbles. In particular, the process is to permit the simultaneous coating of both sides of printed circuit boards. It is also to be possible to coat printed circuit boards having relatively high conductive tracks and at the same time reliably to cover any through-plating holes that are present. Undercuts at the edges of the conductors are to be filled completely with coating. After drying, the surface of the coating is to be substantially non-tacky and permit exposure using the contact-exposure process. There is also to be provided an apparatus that allows the process according to the invention to be carried out.

SUMMARY OF THE INVENTION

All those problems and other associated problems are solved by a process and an apparatus according to independent patent claims 1 and 13, respectively. Especially preferred variants of the process according to the invention and of the associated apparatus according to the invention are the subject of the corresponding dependent process and apparatus claims, respectively. In particular, the invention provides a process for coating printed circuit boards with a coating composition that is crosslinkable by electromagnetic radiation, especially UV radiation, using the roll coating process, which process is distinguished by the following process steps:

- a photopolymerisable, meltable, low-molecular-weight coating composition that is highly viscous to solid at room temperature and has an average molecular weight of preferably from 500 to 1500 is melted and fed to the applicator roll of a roll coating apparatus;
- the coating composition is coated at a temperature of approximately from 60° to 110° C. and a viscosity of approximately from 1000 to 20000 mPas on to the surface(s) of a printed circuit board in a thickness of approximately from 10 to 200 μm,
- the surface of the printed circuit board to be coated being pre-heated, prior to coating, to a temperature that is approximately from 10° to 50° C. higher than the application temperature of the coating composition.

The meltable coating composition is coated at a high viscosity of from 1000 to 20000 mPas and under a high pressure, applied preferably on both sides, by means of heated rubberised applicator rolls having a temperature of from 60° to 110° C., to heated printed circuit boards having a temperature that is from 10° to 50° C. higher than the temperature of the applicator rolls. The high viscosity on the applicator roll prevents the coating composition from being squeezed out over the conductors. The high line pressure, which is preferably applied on both sides, together with the decreasing viscosity of the coating composition on the printed circuit board, ensures that all hollow spaces beneath the conductors are filled completely. The coating composition is liquefied even further on the hotter surface of the printed circuit board and flows to the edges of the conductors, thus covering them in the optimum manner.

The process according to the invention for coating printed circuit boards with a meltable coating composition using a roll coating apparatus eliminates the problems encountered hitherto, such as coating composition being squeezed out over the conductors, air being trapped, and hollow spaces being left beneath the conductors. In contrast to the method of curtain pouring on to cooled printed circuit boards described in WO 93/14444, it is also possible to provide structured printed circuit boards having conductive tracks with a reliable, high-quality coating.

The apparatus according to the invention for coating printed circuit boards with a coating composition that is crosslinkable by electromagnetic radiation, especially UV radiation, is a roll coating apparatus having at least one applicator roll and devices for applying the coating composition to the applicator roll. It comprises a melting vessel for a photopolymerisable, meltable, low-molecular-weight coating composition that is highly viscous to solid at room temperature and has an average molecular weight of preferably from 500 to 1500, which melting vessel can be heated and the temperature of which can be controlled and from which the molten coating composition is fed to the applicator roll, and also a device for pre-heating the surface of the printed circuit board that is to be coated, in which device the surface of the printed circuit board is pre-heated, prior to coating, to a temperature that is approximately from 10° to 50° C. higher than the application temperature of the coating composition, the temperature of the surface of the printed circuit board not exceeding a temperature of from 70° to 160° C.

The use of a rubberised applicator roll allows uneven areas of structured printed circuit boards having conductive tracks to be better compensated for. The melt resist is largely solventless and substantially solidifies at room temperature. A heating device upstream of the roll coating apparatus ensures that the temperature of the printed circuit board is higher than the application temperature of the coating composition, but does not exceed 160° C. As a result, the coating composition is not exposed to relatively high temperatures until it comes into contact with the printed circuit board, where its viscosity decreases so that it is able to flow into the smallest spaces and cover all areas thoroughly. On the other hand, the temperature of the printed circuit board is not so high that the bonds in the coating composition are able to decompose. The application viscosity of the coating composition is, however, sufficiently high that through-plating holes are covered reliably.

BRIEF DESCRIPTION OF THE DRAWINGS

The invention and its associated essential details are described in greater detail below with reference to the single FIGURE, which shows a diagrammatic view of a roll coating apparatus according to the invention.

DESCRIPTION OF THE INVENTION

The process according to the invention is carried out using a roll coating apparatus. Depending upon the desired type of coating, one-sided or two-sided, the apparatus may be a single roll coating apparatus for one-sided coating, or two one-sided roll coating apparatuses can be connected in series. In the latter case, a turning station is arranged between the two apparatuses. For the two-sided coating of printed circuit boards it is, however, preferred to use a two-sided roll coating apparatus 10, as is shown by way of example in the single FIGURE. The apparatus shown is in particular a two-sided roll coating apparatus 10 that is equipped for the simultaneous coating of both sides of the printed circuit boards and that has two heatable applicator rolls 1, 3. The applicator surface of the applicator rolls 1, 3 is preferably rubberised. The flexibility of the rubber coating is so chosen that uneven areas of the surface of the printed circuit board, such as are caused, for example, by conductive tracks having different heights, can readily be compensated for. Immediately adjacent to each applicator roll 1, 3 there is arranged a metering roll 2, 4, which is likewise heatable. The metering rolls are so arranged that a narrow gap remains between the metering roll 2, 4 and the respective applicator roll. The width of the gap defines the thickness of the film of coating composition that forms on the applicator roll 1, 3. For supplying the coating composition there is preferably provided above the applicator rolls 1, 3 a heatable storage container 5 for the coating composition, from which heat-insulated or heatable supply pipes 6, 7 lead to the respective pair of rolls 1, 2 and 3, 4. The upper and lower applicator rolls 1, 3 are preferably arranged at a distance from each other that corresponds approximately to from 50% to 95% of the thickness of the printed circuit board.

The metering gap between the rubberised applicator rolls 1, 3, which can be heated to from 60° to 110° C., and the metering rolls 2, 4, which can be heated to from 70° to 160° C., is so set that a trough of coating composition is formed between the rolls. The coating composition, which is highly viscous to solid at room temperature, is liquefied in the storage container 5 to such an extent that it can be fed to the two pairs of rolls 1, 2 and 3, 4. For coating, the printed circuit boards L are transported through the gap between the two applicator rolls 1, 3 at a speed of approximately from 5 to 20 m/minute. Because the applicator rolls and the metering rolls are heatable, it is possible to bring the coating composition to the required application temperature and the required application viscosity only immediately before it is coated on to the surface of the printed circuit board. The meltable coating composition that is used preferably has a softening range of approximately from 20° to 80° C.

Prior to coating, the printed circuit boards L are brought to the desired coating temperature in a temperature-control device 8 arranged upstream of the roll coating apparatus 10. In particular, the printed circuit boards L are so heated in a temperature-control device 8, prior to coating, that the temperature of their surface is from 10° to 50° C. higher than the temperature of the coating composition applied. In this manner, the coating composition is liquefied even further on the surface of the printed circuit board in order better to compensate for any uneven areas. The application viscosity of the coating composition is approximately from 1000 to 20000 mPas, preferably approximately from 8000 to 12000 mPas. The relatively high application viscosity of the coating composition ensures that through-plating holes are covered thoroughly with coating composition. The temperature of the surface of the printed circuit boards is so set that the viscosity of the coating composition over the drill holes is decreased only to such a degree that the coating composition is unable to flow away and coverage is maintained.

In a tempering station 9 arranged downstream of the roll coating apparatus 10, the coated printed circuit boards L are tempered, if necessary, in order to achieve a non-tacky surface. However, an exposure station may also be arranged downstream, in which the coated surface of the printed circuit boards is exposed to UV radiation for a short time in order to achieve pre-crosslinking at the surface and thus obtain a non-tacky surface. A combination of a tempering station 9 and an exposure station is also possible.

The coating can be used as an etching or electro resist that is removed again after the corresponding treatment of the printed circuit boards. It may, however, also be used as a permanent resist for additive processes, as a solder mask or as a mask for the production of high solder deposits.

The invention is to be described in greater detail by means of the following Examples. For the preparation of the various exemplary coating compositions, the following resin components are used:

Resin component A: A resin that is crosslinkable by means of radiation, is solid at room temperature and has an average molecular weight of 860, a softening range of from 30° to 40° C. and a viscosity at 70° C. of from 10000 to 20000 mPa.s, obtained by reacting 1 equivalent of a diglycidyl ether of bisphenol A having a molecular weight of from 188 to 220 with 1.1 equivalents of acrylic acid and then reacting the resulting product with 0.8 equivalents of hexahydrophthalic acid anhydride, the reaction being carried out for 3 hours at 80° C.

Resin component B: A resin that is crosslinkable by means of radiation, is heat-curable, is solid at room temperature and has a softening point of from 20° to 30° C. and a viscosity at 80° C. of from 2000 to 5000 mPa.s. The resin is obtained by reacting 1 mol of a triglycidyl ether of cresol novolak having a molecular weight of approximately 580 with 1 mol of acrylic acid.

Resin component B1: A resin that is crosslinkable by radiation, obtained by reacting the above-described resin component B for 3 hours at 60° C. with an unsaturated isocyanato carbamate ester having a molecular weight of 290, which has been obtained by reacting 1 mol of toluylene-2,4- and -2,6-diisocyanate isomeric mixture with 1 mol of hydroxyethyl acrylate in accordance with EP-A-0 194 360, Example 2. Resin component B1 has a molecular weight of 950, an epoxide equivalent of 475 and a viscosity of 200000 mpa.s at room temperature and from 500 to 1000 mPa.s at 70° C.

Resin component C: Cresol novolak containing flow agent and a photoinitiator and having a molecular weight of 534, with the following composition:
60 parts by weight of cresol novolak having a molecular weight of 460,
30 parts by weight of 2-ethylanthraquinone,
5 parts by weight of savinyl blue, and
5 parts by weight of flow agent Byk®361.

Resin component D: Cresol novolak containing flow agent, photoinitiator and curing accelerator and having a molecular weight of 534, with the following composition:
50 parts by weight of cresol novolak having a molecular weight of 460,
10 parts by weight of 2-methylimidazole,
30 parts by weight of 2-ethylanthraquinone,
5 parts by weight of heliofast green, and
5 parts by weight of flow agent Byk®361.

EXAMPLE 1

An etching or electro resist is to be coated on to the surface(s) of printed circuit boards.

| Printed circuit board: | base material FR 4, thickness: | 1.6 mm |
|---|---|---|
| | copper cladding: | 17.5 µm |
| | temperature: | 120° C. |
| Coating composition 1: | 64 parts by weight of resin component A, | |
| | 32 parts by weight of resin component B1, | |
| | 3 parts by weight of 2-ethylanthraquinone, | |
| | 0.5 part by weight of flow agent Byk ®361, and | |
| | 0.5 part by weight of savinyl blue. | |

To produce an etching resist or an electro resist, coating composition 1 is coated on to the printed circuit boards using a roll coating apparatus.

Applicator roll temperature: 80° C.
Application viscosity of coating composition 1: 1000 mPas Coating thickness in the case of etching resist: 10 µm
Transport speed of the printed circuit board during coating: 20 m/minute Coating thickness in the case of electro resist: 40 µm
Transport speed of the printed circuit board during coating: 10 m/minute The coated printed circuit board is tempered in a vertical position for 3 to 10 minutes at a temperature of 110°–120° C. During that time, the components of the coating undergo pre-crosslinking and produce a non-tacky surface after the printed circuit board has cooled to room temperature.

EXAMPLE 2

Using the two-sided roll coating process, a coating that is solid at room temperature is coated on to the surfaces of printed circuit boards and gives a non-tacky surface after cooling to room temperature.

| Printed circuit board: | base material FR 4, thickness: | 1.6 mm |
| --- | --- | --- |
| | copper cladding: | 17.5 μm |
| | temperature: | 140° C. |
| Coating composition 2: | 90 parts by weight of resin component A, and 10 of resin component C. | |

The meltable coating composition is applied to produce a non-tacky etching or electro resist.
Applicator roll temperature: 110° C.
Application viscosity of the coating composition: 1000 mPas Coating thickness in the case of etching resist: 10 μm
Transport speed of the printed circuit board during coating: 20 m/minute Coating thickness in the case of electro resist: 40 μm
Transport speed of the printed circuit board during coating: 10 m/minute The coated printed circuit boards are left in a vertical position to cool and have a non-tacky surface at room temperature.

EXAMPLE 3

Solder masks in thicknesses of 30 μm and 100 μm are prepared by applying a meltable coating composition that is solid at room temperature, using the roll coating process:

| Printed circuit board: | base material FR 4, thickness: | 1.6 mm |
| --- | --- | --- |
| | conductor height: | 60 μm |
| | conductor width: | 100 μm |
| | conductor spacing: | 150 μm |
| | temperature: | 90° C. |
| Coating composition 3: | 50 parts by weight of resin component A, | |
| | 40 parts by weight of resin component B, and | |
| | 10 parts by weight of resin component D. | |

Applicator roll temperature: 70° C.
Application viscosity of coating composition 3: 10000 mPas Coating thickness: 30 μm
Transport speed of the printed circuit boards during coating: 20 m/minute Coating thickness: 100 μm
Transport speed of the printed circuit boards during coating: 15 m/minute After coating, the printed circuit boards cool to room temperature in a vertical position. Their coated surface is non-tacky at room temperature.

What is claimed is:

1. A process for coating printed circuit boards using a roll coating process, wherein
   a photopolymerizable, meltable coating composition that is viscous to solid at room temperature and has an average molecular weight of from 500 to 1500 is melted and fed to an applicator roll of said roll coating process, and
   the coating composition is coated at a temperature of approximately from 60° to 110° C. and a viscosity of approximately from 1000 to 20000 mPas onto the surface(s) of a printed circuit board in a thickness of approximately from 10 to 200 μm,
   the surface of the printed circuit board to be coated being pre-heated prior to coating.

2. A process according to claim 1, wherein the temperature of the surface of the printed circuit board to be coated is adjusted to a temperature of approximately 70° to 160° C. such that it is approximately from 10° to 50° C. higher than the application temperature of the coating composition.

3. A process according to claim 1, wherein the coating composition is brought to the application temperature and the application viscosity, by means of heatable applicator rolls, before it is coated onto the surface(s) of the printed circuit board.

4. A process according to claim 1, wherein a through-gap between applicator rolls of the roll coating apparatus is adjusted to approximately from 50% to 95% of the thickness of the printed circuit board.

5. A process according to claim 1, wherein a coating composition having a softening range of approximately from 20° to 80° C. is used.

6. A process according to claim 1, wherein top and bottom surfaces of the printed circuit boards are coated, the coating being carried out simultaneously.

7. A process according to claim 1, wherein, after application and before further processing, the coating is partially crosslinked by a tempering step or brief exposure to UV radiation in order that the printed circuit board has a non-tacky surface.

8. A process according to claim 1, wherein the coating produces a solder mask.

9. A process according to claim 1, wherein the coating is used as a mask for the production of solder deposits.

10. A process according to claim 1, wherein the coating produces an etching or electro resist.

11. A process according to claim 1, wherein the coating produces a permanent resist for additive processes.

12. A process according to claim 1, wherein the coating covers rest-ring-free through-holes located on said printed circuit board.

13. The process according to claim 1, wherein said applicator rolls are rubberized or rubber coated.

14. An apparatus for coating printed circuit boards using a roll coating apparatus having at least one applicator roll and devices for applying the coating composition to applicator rolls, wherein the roll coating apparatus is equipped with a melting vessel for a, meltable photopolymerizable coating composition that is viscous to solid at room temperature and has an average molecular weight of from 500 to 1500, which melting vessel can be heated and the temperature of which can be controlled to an application temperature of approximately from 60° to 110° C. and from which the melted coating composition is fed to the applicator roll, and wherein there is provided a device for pre-heating the surface of the printed circuit board that is to be coated, in which device the surface of the printed circuit board is pre-heated prior to coating.

15. An apparatus according to claim 14, wherein the roll coating apparatus comprises at least one heatable applicator roll by means of which the meltable coating composition can be brought to an application viscosity of approximately from 1000 to 20000 mPas before it is coated onto the surface of the printed circuit board.

16. An apparatus according to claim 14, wherein devices for applying the coating composition to the applicator rolls comprise at least one metering roll, which is heatable and the temperature of which can be adjusted to approximately from 70° to 160° C.

17. An apparatus according to claim 14, wherein the roll coating apparatus is arranged for the simultaneous coating of both sides of the printed circuit boards and comprises two heatable metering rolls as well as two heatable applicator rolls, between which there is left a through-gap of variable width that is approximately from 50% to 95% of the thickness of the printed circuit boards to be coated.

18. An apparatus according to claim 14, wherein there is arranged down-stream of the roll coating apparatus a tempering station or a UV exposure station in which the coating of the printed circuit board can be rendered non-tacky by tempering or by brief exposure to UV radiation.

19. An apparatus according to claim 14, wherein said at least one applicator roll is rubberized.

* * * * *